United States Patent
Mitani et al.

(10) Patent No.: US 12,187,014 B2
(45) Date of Patent: Jan. 7, 2025

(54) PHOSPHOR PARTICLES, COMPOSITE, WAVELENGTH CONVERSION MEMBER, AND PROJECTOR

(71) Applicant: DENKA COMPANY LIMITED, Tokyo (JP)

(72) Inventors: Shunsuke Mitani, Tokyo (JP); Keita Kobayashi, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 18/017,784

(22) PCT Filed: Jul. 9, 2021

(86) PCT No.: PCT/JP2021/025958
§ 371 (c)(1),
(2) Date: Jan. 24, 2023

(87) PCT Pub. No.: WO2022/024722
PCT Pub. Date: Feb. 3, 2022

(65) Prior Publication Data
US 2024/0269968 A1 Aug. 15, 2024

(30) Foreign Application Priority Data
Jul. 30, 2020 (JP) .............................. 2020-128976

(51) Int. Cl.
*B32B 27/08* (2006.01)
*B32B 37/10* (2006.01)
(Continued)

(52) U.S. Cl.
CPC .............. *B32B 27/08* (2013.01); *B32B 37/10* (2013.01); *B32B 38/0036* (2013.01);
(Continued)

(58) Field of Classification Search
CPC ...... B32B 2038/0076; B32B 2307/422; B32B 2307/7376; B32B 2309/025; B32B 27/08;
(Continued)

(56) References Cited

U.S. PATENT DOCUMENTS 8,287,759 B2  10/2012  Collins et al.
8,608,979 B2  12/2013  Collins et al.
(Continued)

FOREIGN PATENT DOCUMENTS

CN  102459504 A  5/2012
CN  105228972 A  1/2016
(Continued)

OTHER PUBLICATIONS

Sato, JP 2019-186530 A (Year: 2019).*
(Continued)

*Primary Examiner* — Lawrence D Ferguson
(74) *Attorney, Agent, or Firm* — Oliff PLC

(57) ABSTRACT

Phosphor particles for producing a wavelength conversion member of a projector, including CASN, and/or SCASN. A cured sheet having a film thickness of 50±5 μm produced by using the particle satisfies the following optical characteristics: when an intensity at a peak wavelength of blue light emitted from a blue LED having a peak wavelength between 450 to 460 nm is defined as Ii [W/nm], and where the blue light is emitted to one surface side of the cured sheet, when an intensity of light emitted from the other surface side of the cured sheet at a peak wavelength between 450 to 460 nm is defined as It [W/nm] and an intensity thereof at a peak wavelength between 600 to 650 nm is defined as Ip [W/nm], It/Ii is equal to or less than 0.2 and Ip/Ii is equal to or more than 0.05.

7 Claims, 1 Drawing Sheet

(51) Int. Cl.
*B32B 38/00* (2006.01)
*C09K 11/02* (2006.01)
*C09K 11/64* (2006.01)
*G03B 21/20* (2006.01)

(52) U.S. Cl.
CPC ............ *C09K 11/025* (2013.01); *C09K 11/64* (2013.01); *B32B 2038/0076* (2013.01); *B32B 2307/422* (2013.01); *B32B 2307/7376* (2023.05); *B32B 2309/025* (2013.01); *G03B 21/204* (2013.01)

(58) Field of Classification Search
CPC ..... B32B 37/10; B32B 38/0036; C09K 11/02; C09K 11/025; C09K 11/64; G02B 5/20; G03B 21/14; G03B 21/204; H01L 33/50
See application file for complete search history.

(56) References Cited

U.S. PATENT DOCUMENTS

| | | |
|---|---|---|
| 9,206,959 B2 | 12/2015 | Kashiwagi et al. |
| 11,434,421 B2 | 9/2022 | Sugita et al. |
| 11,749,785 B2 | 9/2023 | Nojima et al. |
| 2010/0289045 A1 | 11/2010 | Collins et al. |
| 2013/0001470 A1 | 1/2013 | Collins et al. |
| 2013/0201456 A1 | 8/2013 | Kashiwagi et al. |
| 2016/0060517 A1 | 3/2016 | Pohl-Klein et al. |
| 2019/0062631 A1 | 2/2019 | Kobayashi et al. |
| 2019/0097095 A1 | 3/2019 | Yamanaka et al. |
| 2021/0278053 A1 | 9/2021 | Yamanaka et al. |
| 2021/0324267 A1 | 10/2021 | Sugita et al. |
| 2021/0384385 A1 | 12/2021 | Nojima et al. |

FOREIGN PATENT DOCUMENTS

| | | |
|---|---|---|
| CN | 109154425 A | 1/2019 |
| CN | 112745835 A | 5/2021 |
| JP | 2009-173905 A | 8/2009 |
| JP | 2013-162021 A | 8/2013 |
| JP | 2013-170184 A | 9/2013 |
| JP | 2020-012010 A | 1/2020 |
| JP | 2020-084177 A | 6/2020 |
| TW | 202024298 A | 7/2020 |
| WO | 2017/122800 A1 | 7/2017 |
| WO | 2020/054351 A1 | 3/2020 |

OTHER PUBLICATIONS

Oct. 25, 2023 Office Action and Search Report issued in Chinese Patent Application No. 202180050004.9.
Aug. 13, 2024 Office Action and Search Report issued in Taiwanese Patent Application No. 110125970.
Oct. 5, 2021 International Search Report issued in International Patent Application No. PCT/JP2021/025958.

\* cited by examiner

PHOSPHOR PARTICLES, COMPOSITE, WAVELENGTH CONVERSION MEMBER, AND PROJECTOR

TECHNICAL FIELD

The present invention relates to phosphor particles, a composite, a wavelength conversion member, and a projector. More specifically, the present invention relates to phosphor particles for producing a wavelength conversion member of a projector, a composite using the particles, a wavelength conversion member including the composite, and a projector including the wavelength conversion member.

BACKGROUND ART

There are several types of projectors capable of projecting color images, and in recent years, a type using blue laser light has been actively studied.

This type of projector usually includes a blue light source, and a wavelength conversion member in which a wavelength conversion layer including a phosphor which converts blue light from the blue light source into green light or red light is formed on a transparent substrate. In general, it is possible to obtain the green light or red light as the blue light passes through (transmits) the wavelength conversion member.

Incidentally, the wavelength conversion member rotates during the use of the projector so that only a specific portion is not continuously irradiated with the blue light. Due to such a mechanism, the wavelength conversion member of the projector is also referred to as a "phosphor wheel".

For example, Patent Document 1 discloses a wavelength conversion element including a substrate and a phosphor layer provided on the substrate, or a projector equipped with this wavelength conversion element. A volume concentration of the phosphor in the phosphor layer of this wavelength conversion element is 15 vol % or more.

RELATED DOCUMENT

Patent Document

[Patent Document 1] Japanese Unexamined Patent Publication No. 2013-162021

SUMMARY OF THE INVENTION

Technical Problem

For a phosphor used in a wavelength conversion member, it is preferable that the phosphor itself has high light emitting efficiency/light conversion efficiency. In addition, for example, in a case where the wavelength conversion member is a transmission type, properties of light emitted from an "opposite side" of a blue light source are important in determining performance of a projector (for example, a range of color gamut).

However, according to the findings of the inventors of the present invention, phosphors of the related art has not been designed in consideration of application to the wavelength conversion member of the projector, and there is room for improvement. For example, the phosphor (phosphor particles) used for producing white LEDs of the related art is not suitable to produce the wavelength conversion member of the projector.

The present invention has been made in view of such circumstances. One of the objects of the present invention is to provide phosphor particles that are preferably applicable to production of a wavelength conversion member of a projector.

Solution to Problem

The inventors of the present invention have completed the present invention provided below and solved the problem described above.

The present invention is as follows.

According to the present invention, there is provided phosphor particles for producing a wavelength conversion member of a projector, the phosphor particles including CASN and/or SCASN, in which a cured sheet produced by the following sheet producing procedure satisfies the following optical characteristics.

<Sheet Producing Procedure>
(1) 40 parts by mass of the phosphor particle and 60 parts by mass of a silicone resin OE-6630 manufactured by Dow Corning Toray Co., Ltd. are subjected to a stirring treatment and a defoaming treatment using a rotation and revolution mixer to obtain a uniform mixture.
(2) The mixture obtained in the section (1) is added dropwise to a transparent first fluororesin film, a transparent second fluororesin film is further laminated on the dropped material to obtain a sheet-like material. This sheet-like material is molded into an uncured sheet using a roller having a gap in which 50 μm is added to a total thickness of the first fluororesin film and the second fluororesin film.
(3) The uncured sheet obtained in the section (2) is heated under conditions of 150° C. and 60 minutes. Then, the first fluororesin film and the second fluororesin film are peeled off to obtain a cured sheet having a film thickness of 50±5 μm.

<Optical Characteristics>
When an intensity at a peak wavelength of blue light emitted from a blue LED having a peak wavelength in a range of 450 nm to 460 nm is defined as $Ii$ [W/nm], and in a case where the blue light is irradiated on one surface side of the cured sheet, an intensity of light emitted from the other surface side of the cured sheet at a peak wavelength in the range of 450 nm to 460 nm is defined as $It$ [W/nm], and an intensity of the light emitted from the other surface side of the cured sheet at a peak wavelength in a range of 600 nm to 650 nm is defined as $Ip$ [W/nm], $It/Ii$ is equal to or less than 0.2 and $Ip/Ii$ is equal to or more than 0.05.

In addition, the present invention is as follows.
A composite includes the phosphor particle, and a sealing material that seals the phosphor particle.

In addition, the present invention is as follows.
A wavelength conversion member includes the composite.

In addition, the present invention is as follows.
A projector includes the wavelength conversion member.

Advantageous Effects of Invention

According to the present invention, the phosphor particles that are preferably applicable to the production of the wavelength conversion member of the projector are provided.

DESCRIPTION OF EMBODIMENTS

Figure 1:
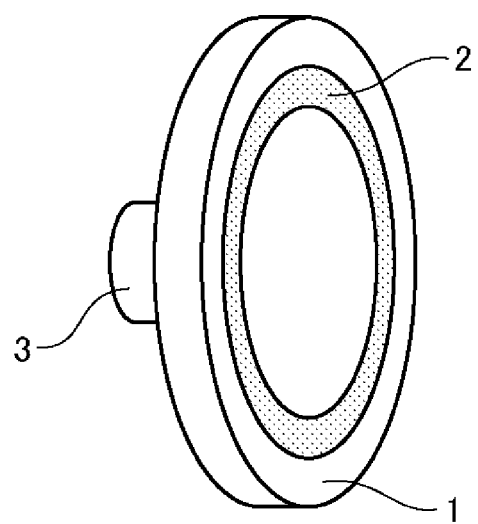
FIG. 1 is a diagram schematically showing an example of a wavelength conversion member.

Hereinafter, an embodiment of the present invention will be described in detail while referring to drawings.

The drawings are for explanation purposes only. A shape or a dimensional ratio of each member in the drawing does not necessarily correspond to an actual article.

In the present specification, the notation "X to Y" in the description of the numerical range indicates X or more and Y or less unless otherwise specified. For example, "1 to 5% by mass" means "equal to or more than 1% by mass and equal to or less than 5% by mass".

In the present specification, "LED" represents an abbreviation for a light emitting diode.

In the present specification, a term "phosphor particle" may, in context, mean a phosphor powder, which is a population of phosphor particles.

<Phosphor Particles for producing Wavelength Conversion Member of Projector>

The phosphor particles of the present embodiment are for producing a wavelength conversion member of a projector. That is, the phosphor particles of the present embodiment are used for producing the wavelength conversion member that converts blue laser light into another color (green or red) in the projector including a blue laser.

The phosphor particle of the present embodiment consists of CASN and/or SCASN. Accordingly, the phosphor particle of the present embodiment generally converts blue light into red light.

A cured sheet produced by the following sheet producing procedure using the phosphor particle of the present embodiment satisfies the following optical characteristics.

<Sheet Producing Procedure>
(1) 40 parts by mass of the phosphor particle and 60 parts by mass of a silicone resin OE-6630 manufactured by Dow Corning Toray Co., Ltd. are subjected to a stirring treatment and a defoaming treatment using a rotation and revolution mixer to obtain a uniform mixture.
(2) The mixture obtained in the section (1) is added dropwise to a transparent first fluororesin film, and a transparent second fluororesin film is further laminated on the dropped material to obtain a sheet-like material. This sheet-like material is molded into an uncured sheet using a roller having a gap in which 50 μm is added to a total thickness of the first fluororesin film and the second fluororesin film.

Here, the expression "molded into an uncured sheet using a roller having a gap" means passing a sheet-like material through a gap between a set of rollers installed to face each other.

In addition, the first fluororesin film and the second fluororesin film are preferably the same film. In this case, the gap of the roller is obtained by adding 50 μm to twice the thickness of one film.

(3) The uncured sheet obtained in the section (2) is heated under conditions of 150° C. and 60 minutes. Then, the first fluororesin film and the second fluororesin film are peeled off to obtain a cured sheet having a film thickness of 50±5 μm.

<Optical Characteristics>

When an intensity at a peak wavelength of blue light emitted from a blue LED having a peak wavelength in a range of 450 nm to 460 nm is defined as Ii [W/nm], and in a case where the blue light is emitted to one surface side of the cured sheet, when an intensity of light emitted from the other surface side of the cured sheet at a peak wavelength in a range of 450 nm to 460 nm is defined as It [W/nm] and an intensity thereof at a peak wavelength in a range of 600 nm to 650 nm is defined as Ip [W/nm], It/Ii is equal to or less than 0.2 and Ip/Ii is equal to or more than 0.05.

In order to obtain phosphor particles suitable for producing the wavelength conversion member of the projector, the inventors of the present invention considered that the phosphor particles are required to be designed in consideration of a mechanism of the wavelength conversion of the projector, that is, a system in that green light or red light is obtained as blue light "passes through (transmits)" the wavelength conversion member.

Based on this idea, the inventors of the present invention produced a sheet including a phosphor particle consisting of CASN and/or SCASN and a specific resin by the method described in the section <Sheet Producing Procedure> and employed an index regarding the transmitted light, in a case where the sheet is placed on a blue LED, as a design index. Specifically, It/Ii was set as an index corresponding to a degree of absorption of blue light of the sheet, and Ip/Ii was set as an index corresponding to a degree of conversion efficiency from blue light to red light of the sheet, respectively.

Then, the inventors of the present invention found that the phosphor particles having It/Ii of equal to or less than 0.2 and Ip/Ii of equal to or more than 0.05 are preferably applied to the wavelength conversion member of the projector. The configuration of the wavelength conversion member of the projector by such phosphor particles leads to an increase in color gamut of the projector.

In addition, in a case where the silicone resin OE-6630 manufactured by Dow Corning Toray Co., Ltd. is not available when producing the sheet, as a substitute, a silicone material for LED SCR-1011, SCR-1016 or KER-6100/CAT-PH of Shin-Etsu Chemical Co., Ltd. can be used (the amount used is the same as that of OE-6630). According to the findings of the inventors of the present invention, even if these materials manufactured by Shin-Etsu Chemical Co., Ltd. are used instead of OE-6630, the value of It/Ii and the value of Ip/Ii are almost the same.

When obtaining the phosphor particle of the present embodiment, it is important not only to select an appropriate material but also to select an appropriate producing method and producing conditions. By appropriately selecting the producing method and producing conditions, a particle diameter, a particle shape, and the like are appropriately controlled, and accordingly, it is likely to obtain a phosphor particle in that It/Ii is equal to or less than 0.2 and Ip/Ii is equal to or more than 0.05.

The details of the producing conditions will be described later, and for example, by appropriately selecting the conditions such as a low-temperature firing step (annealing step), an acid treatment step, and a crushing step which will be described later, it is possible to obtain a phosphor particle in which It/Ii is equal to or less than 0.2 and Ip/Ii is equal to or more than 0.05.

It/Ii may be equal to or less than 0.2 and is preferably equal to or less than 0.15 and more preferably equal to or less than 0.1. A lower limit of It/Ii may be zero.

Ip/Ii may be equal to or more than 0.05 and is preferably equal to or more than 0.07 and more preferably equal to or more than 0.1. An upper limit of Ip/Ii is, for example, 0.5, from a viewpoint of practical design.

In addition, the wavelength conversion element produced using the phosphor particles of the present embodiment tends to generate comparatively small heat due to the irradiation of blue light. This is considered because a thin phosphor layer (composite) is likely to be formed, since the phosphor particles of the present embodiment are designed in consideration of "transmission" of light (it is considered that, as the phosphor layer is thin, the heat generation is suppressed).

Hereinafter, the description of the phosphor particle of the present embodiment will be continued.
(General Formula/Composition of CASN and SCASN)

The phosphor particle of the present embodiment consists of CASN and/or SCASN.

Generally, CASN is a phosphor in which a main crystal phase has the same crystal structure as that of $CaAlSiN_3$ and a general formula is represented by $MAlSiN_3$:Eu (M is one or more elements selected from Sr, Mg, Ca, and Ba). Among them, an Sr-containing phosphor in which a main crystal phase has the same crystal structure as that of $CaAlSiN_3$ and a general formula is represented by (Sr, Ca) $AlSiN_3$:Eu is SCASN. CASN or SCASN acts as a red light emitting phosphor mainly because a part of $Ca^{2+}$ of $CaAlSiN_3$ is replaced with $Eu^{2+}$ which acts as a light emitting center.

Whether or not the main crystal phase of the produced CASN or SCASN has the same crystal structure as the $CaAlSiN_3$ crystal can be confirmed by powder X-ray diffraction.

The phosphor particle of the present embodiment does not exclude CASN/SCASN containing unavoidable elements and impurities. However, from a viewpoint of excellent light emission characteristics or improvement of display visibility, it is better to have few unavoidable elements and impurities.

An oxygen content of the phosphor particle of the present embodiment is preferably equal to or more than 18 by mass and more preferably equal to or more than 18 by mass and equal to or less than 5% by mass.

The CASN/SCASN phosphor may react with moisture and deteriorate. It is preferable to form an oxide film on a particle surface in order to prevent deterioration. As a result of oxide film formation, the oxygen content can be the value described above. In addition, since a specific surface area increases as a particle diameter decreases, an oxide film area of the particle surface tends to increase and an amount of oxygen tends to increase. Further, the oxide film is normally formed by an acid treatment step which will be described later.
(Particle Diameter)

In a case where a volume-based cumulative 50% diameter and a volume-based cumulative 90% diameter of the phosphor particle of the present embodiment measured by a laser diffraction and scattering method are defined as $D_{50}$ and Doc, respectively, $D_{50}$ is, for example, equal to or less than 10 μm, preferably equal to or less than 5 μm, more preferably equal to or more than 0.2 μm and equal to or less than 5 μm, and even more preferably equal to or more than 0.5 μm and equal to or less than 3 μm. $D_{90}$ is, for example, equal to or less than 17 μm, preferably equal to or less than 10 μm, more preferably equal to or less than 8 μm, and even more preferably equal to or less than 5 μm. A lower limit of Doo is, for example, 2 μm, specifically 3 μm, and more specifically 5 μm.

$D_{50}$ and $D_{90}$ are values measured by using a liquid obtained by putting 0.5 g of the phosphor particle into 100 mL of an ion exchange aqueous solution containing 0.05% by mass of sodium hexametaphosphate, and performing a dispersion treatment for 3 minutes by placing a chip in a center portion of the liquid using an ultrasonic homogenizer having a transmission frequency of 19.5±1 kHz and an amplitude of 31±5 μm.
(Various Characteristics)

For the phosphor particle of the present embodiment, a light absorption rate with respect to light having a wavelength of 700 nm is preferably equal to or less than 20%, more preferably equal to or less than 15%, and even more preferably equal to or less than 10%. A lower limit of the light absorption rate with respect to light having a wavelength of 700 nm is practically 1%.

As light having a wavelength that Eu, which is an activating element of a phosphor, does not originally absorb, there is light having a wavelength of 700 nm. By evaluating the amount of light absorption rate having a wavelength of 700 nm, a degree of absorption of excess light due to defects in the phosphor or the like can be confirmed. Then, by producing the phosphor particle having a small light absorption rate with respect to light having a wavelength of 700 nm, it is possible to obtain a phosphor particle preferable to be used in the wavelength conversion member of the projector.

For the phosphor particle of the present embodiment, a light absorption rate at 455 nm is preferably equal to or more than 758 and equal to or less than 99% and more preferably equal to or more than 80% and equal to or less than 968. By designing the light absorption rate at 455 nm to be within this numerical range, the light from the blue LED is not unnecessarily transmitted, which is preferable for application to the wavelength conversion member of the projector.

For the phosphor particle of the present embodiment, an internal quantum efficiency is preferably equal to or more than 50%, more preferably equal to or more than 608, and even more preferably equal to or more than 65%. In a case where the internal quantum efficiency is equal to or more than 50%, the light from the blue LED is appropriately absorbed and sufficient red light is released. An upper limit of the internal quantum efficiency is not particularly limited, and is, for example, 90%.

For the phosphor particle of the present embodiment, an external quantum efficiency is preferably equal to or more than 358, more preferably equal to or more than 50%, and even more preferably equal to or more than 608. In a case where the external quantum efficiency is equal to or more than 35%, the light from the blue LED is appropriately absorbed and sufficient red light is released. An upper limit of the external quantum efficiency is not particularly limited, and is, for example, equal to or less than 86%.
(Method for Producing Phosphor Particle)

The method for producing the phosphor particle of the present embodiment is not particularly limited. It can be produced by selecting an appropriate producing method and producing conditions, in addition to the selecting of the appropriate material.

Mixing step of mixing a starting raw material to form a raw material mixed powder, Firing step of firing the raw material mixed powder obtained in the mixing step to obtain a fired product, A low-temperature firing step (an annealing step) performed after a fired product obtained in the firing step is once powderized, Crushing step of crushing and pulverizing the low-temperature fired powder obtained after the low-temperature firing step, A decantation step of removing a fine powder generated in the crushing step, and Acid treatment step of removing impurities that are considered to be derived from the firing step.

In addition, in the present embodiment, the term "step" includes not only independent steps but also steps that cannot be clearly distinguished from other steps as long as the intended purpose of the step is achieved.

As the findings of the inventors of the present invention, particularly, by (i) performing the crushing step under appropriate conditions using a ball mill, (ii) performing the decantation step appropriately, and (iii) performing the acid treatment step appropriately, it is likely to produce a phosphor particle in which It/Ii is equal to or less than 0.4 and Ip/Ii is equal to or more than 0.03. Such a producing method is different from the CASN/SCASN producing method of the related art. However, for the phosphor particles of the present embodiment, various other specific producing conditions can be adopted on the premise that the above-described production efforts are adopted.

Hereinafter, each step will be described.

Mixing Step

In the mixing step, the starting raw material is mixed to obtain a raw material mixed powder.

Examples of the starting raw material include a europium compound, a strontium compound such as strontium nitride, a calcium compound such as calcium nitride, silicon nitride such as x-type silicon nitride, and aluminum nitride.

The form of each starting raw material is preferably powder state.

Examples of europium compound include an oxide containing europium, a hydroxide containing europium, a nitride containing europium, an oxynitride containing europium, and a halide containing europium. These can be used alone or in combination of two or more. Among them, europium oxide, europium nitride and europium fluoride are preferably used alone, and europium oxide is more preferably used alone.

In the firing step, europium is divided into those that are doped, those that volatilize, and those that remain as a heterogeneous phase component. The heterogeneous phase component containing europium can be removed by an acid treatment or the like. However, in a case where a significantly large amount thereof is generated, a component insoluble by the acid treatment may be generated and the brightness may decrease. In addition, as long as it is a heterogeneous phase that does not absorb excess light, it may be in a residual state, and europium may be contained in this heterogeneous phase.

A total amount of europium used is not particularly limited, and is preferably 3 times or more the amount of europium doped in the finally obtained phosphor particle, and more preferably 4 times or more.

In addition, the total amount of europium used is not particularly limited, and is preferably 18 times or less the amount of europium doped in the finally obtained phosphor particle. As a result, the amount of insoluble heterogeneous phase components generated by the acid treatment can be reduced, and the brightness of the obtained phosphor particle can be further improved.

In the mixing step, the raw material mixed powder can be obtained by using, for example, a method for dry-mixing the starting raw material, a method for wet-mixing in an inert solvent that does not substantially react with each starting raw material, and then removing the solvent, or the like. As a mixing device, for example, a small-sized mill mixer, a V-type mixer, a rocking mixer, a ball mill, a vibration mill, or the like can be used. After the mixing using the device, the aggregates can be removed by a sieve, as needed, to obtain a raw material mixed powder.

In order to suppress a deterioration of the starting raw material and unintentional mixing of oxygen, it is preferable that the mixing step is performed in a nitrogen atmosphere or in an environment where the water content (humidity) is as low as possible.

Firing Step

In the firing step, the raw material mixed powder obtained in the mixing step is fired to obtain a fired product.

A firing temperature in the firing step is not particularly limited, and is preferably equal to or higher than 1800° C. and equal to or lower than 2100° C. and more preferably equal to or higher than 1900° C. and equal to or lower than 2000° C.

By setting the firing temperature to the lower limit value or higher, the grain growth of the phosphor particles proceeds more effectively. Accordingly, a light absorption rate, an internal quantum efficiency, and an external quantum efficiency can be further improved.

By setting the firing temperature to the upper limit value or lower, the decomposition of the phosphor particles can be further suppressed. Accordingly, the light absorption rate, the internal quantum efficiency, and the external quantum efficiency can be further improved.

Other conditions such as a heating time, a heating rate, a heating holding time, and a pressure in the firing step are not particularly limited, and may be appropriately adjusted according to the raw materials used. Typically, the heating holding time is preferably 3 to 30 hours, and the pressure is preferably 0.6 to 10 MPa. From a viewpoint of controlling oxygen concentration or the like, it is preferable that the firing step is performed in a nitrogen gas atmosphere. That is, it is preferable that the firing step is performed in a nitrogen gas atmosphere having a pressure of 0.6 MPa to 10 MPa.

In the firing step, as a method for firing a mixture, for example, a method of filling the mixture into a container made of a material (tungsten or the like) that does not react with the mixture during firing and heating the mixture in a nitrogen atmosphere can be used.

The fired product obtained through the firing step is normally a granular or lumpy sintered product. The fired product can be once powderized by using treatments such as cracking, crushing, and classification alone or in combination.

Specific examples of the treatment method include a method of crushing the sintered product to a predetermined particle size using a general crusher such as a ball mill, a vibration mill, or a jet mill. However, attention needs to be paid to excessive crush, because fine particles that easily scatter light may be generated or crystal defects may be caused on a particle surface, resulting in a decrease in light emitting efficiency.

Low-Temperature Firing Step (Annealing Step)

After the firing step, a low-temperature firing step (annealing step) may be further included in which the fired product (preferably once powderized) is heated at a temperature lower than the firing temperature in the firing step to obtain a low-temperature fired powder.

The low-temperature firing step (annealing step) is preferably performed in an inert gas such as a rare gas and a nitrogen gas, a reducing gas such as a hydrogen gas, a carbon monoxide gas, a hydrocarbon gas, and an ammonia gas, or a mixed gas thereof, or in a non-oxidizing atmosphere other than pure nitrogen such as a vacuum. The annealing step is particularly preferably performed in a hydrogen gas atmosphere or an argon atmosphere.

The low-temperature firing step (annealing step) may be performed under atmospheric pressure or pressurization. The heat treatment temperature in the low-temperature firing step (annealing step) is not particularly limited, and is preferably 1200 to 1700° C., and more preferably 1300° C. to 1600° C. The time of the low-temperature firing step (annealing step) is not particularly limited, and is preferably 3 to 12 hours, and more preferably 5 to 10 hours. By performing the low-temperature firing step (annealing step), the light emitting efficiency of the phosphor particles can be sufficiently improved. In addition, the rearrangement of the elements removes strains and defects, so that transparency can also be improved. These are preferable, from a viewpoint of adjusting It/Ii and Ip/Ii.

In the low-temperature firing step (annealing step), a heterogeneous phase may occur. However, this can be sufficiently removed by a step which will be described later.
Crushing Step In the crushing step, the powder obtained in the low-temperature firing step (annealing step) is crushed and pulverized.

In particular, it is preferable that the crushing step is performed with respect to the powder after the acid treatment step by using a ball mill. By the crushing at a rotation rate that is neither too fast nor too slow for the time that is neither too long nor too short, it is likely to obtain the phosphor particle in which It/Ii is equal to or less than 0.2 and Ip/Ii is equal to or more than 0.05.

In particular, the crushing by a ball mill is preferably performed by a wet method using ion exchange water and using zirconia balls. Details are not clear, but it is surmised that the properties of the surface of the powder to be treated are appropriately adjusted/modified by using water and zirconia balls.
Decantation Step In the decantation step, the phosphor particles pulverized through the crushing step are put into an appropriate dispersion medium to precipitate the phosphor particles. Then, a supernatant liquid is removed. Accordingly, it is possible to remove fine particles (ultrafine powder) that may negatively affect the optical characteristics. In addition, it is likely to obtain phosphor particles in which It/Ii is equal to or less than 0.2 and Ip/Ii is equal to or more than 0.05.

As the dispersion medium, for example, an aqueous solution of sodium hexametaphosphate can be used.

The decantation operation may be repeated.

After the decantation step is completed, the obtained precipitate is filtered and dried, and if necessary, coarse particles are removed using a sieve. By doing so, it is possible to obtain phosphor particles in which fine particles (ultrafine powder) are reduced.
Acid Treatment Step In the acid treatment step, the phosphor particles, in which fine particles (ultrafine powder) are reduced, obtained in the decantation step are acid-treated. Accordingly, at least a part of impurities that do not contribute to light emission can be removed. In addition, it is assumed that the impurities that do not contribute to light emission are generated during the firing step and the low-temperature firing step (annealing step).

As the acid, an aqueous solution containing one or more acids selected from hydrofluoric acid, sulfuric acid, phosphoric acid, hydrochloric acid, and nitric acid can be used. Particularly, hydrofluoric acid, nitric acid, and a mixed acid of hydrofluoric acid and nitric acid are preferable.

The acid treatment can be performed by dispersing the low-temperature fired powder in an aqueous solution containing the acid described above. A stirring time is, for example, equal to or longer than 10 minutes and equal to or shorter than 6 hours and preferably equal to or longer than 30 minutes and equal to or shorter than 3 hours. A temperature at the time of stirring can be, for example, equal to or higher than 40° C. and equal to or lower than 90° C. and preferably equal to or higher than 50° C. and equal to or lower than 70° C.

After the acid treatment step, substances other than the phosphor particles may be separated by filtration, and the substance attached to the phosphor particles is desirably washed with water.

The phosphor particle of the present embodiment can be obtained by a series of steps described above.

<Composite, Wavelength Conversion Member, and Projector>

FIG. 1 is a diagram schematically showing an example of a wavelength conversion member. The wavelength conversion member of FIG. 1 is a so-called transmissive rotary fluorescent plate.

In the wavelength conversion member, a phosphor layer 2 is formed along a rotation direction of a disc-shaped substrate 1 that is rotationally driven by a motor 3. A region where the phosphor layer 2 is formed includes a blue light incidence region to which blue light (typically blue laser light) from a blue light source is incident.

As the substrate 1 is rotationally driven around a rotation axis by the motor 3, the blue light incidence region moves relative to the substrate 31 around the rotation axis.

The phosphor layer 2 is a composite including the phosphor particles, and a sealing material that seals the phosphor particles.

As the sealing material for forming the phosphor layer 2 (the composite), for example, a silicone resin material can be used. For the silicone resin material, a silicone resin cured by heat and/or light that is supplied from Dow Corning Toray Co., Ltd. and Shin-Etsu Chemical Co., Ltd. is preferable from viewpoints of heat resistance and the like, in addition to transparency. Silicone resin OE-6630 manufactured by Dow Corning Toray Co., Ltd., silicone material LED SCR-1011, SCR-1016, and KER-6100/CAT-PH manufactured by Shin-Etsu Chemical Co., Ltd. are preferred examples of the sealing material. In addition, as the sealing material, an epoxy resin material, a urethane resin material, or the like can be used.

The amount of the phosphor particles in the phosphor layer 2 (the composite) is, for example, 10% to 70% by mass, and preferably 25% to 55% by mass.

The substrate 1 is preferably configured with a material that transmits visible light. Examples of the material of the substrate 1 include quartz glass, crystal, sapphire, optical glass, a transparent resin, and the like. A dielectric multilayer film is provided between the substrate 1 and the phosphor layer 2 (not shown), and the dielectric multilayer film functions as a dichroic mirror, transmits blue light having a wavelength of approximately 450 nm, and reflects light having a wavelength of 490 nm or more including a wavelength range (490 nm to 750 nm) of the phosphor emitted from the phosphor layer 2.

A shape of the substrate 1 is typically disc shape, but is not limited to the disc-shape.

The phosphor layer 2 rotates together with the substrate 1 during use. In such a substrate 1, in a case where the blue light (laser light) is incident on the phosphor layer 2, a part of the phosphor layer 2 corresponding to the blue light incidence region generates heat. As the substrate 1 rotates, this heated part (the heated part) moves in a circle around the rotation axis and returns to the blue light incidence region, and this cycle is repeated. As described above, by sequentially changing an irradiation position of the blue light with respect to the phosphor layer 2, excessive heat generation is suppressed.

At least a part of the blue light incident on the wavelength conversion member is wavelength-converted into red light by the phosphor layer 2 containing CASN and/or SCASN. At least a part of the red light is emitted to a side opposite to a side to which the blue light is incident.

A projector using a blue light source typically includes a blue light source such as a blue laser, a wavelength conversion member that converts a wavelength of blue light emitted from the blue light source, a modulation element that modulates light emitted from the wavelength conversion element by an image signal, and an our optical system that projects the light modulated by the modulation element.

For specific configurations of the wavelength conversion element and the projector, FIG. 1 of Patent Document 1 and the description thereof, the description of JP2013-92796A, and the like can be referred to. In addition, a well-known technology can be appropriately applied to the configuration of the wavelength conversion element and the projector.

The embodiments of the present invention have been described above, but these are examples of the present invention and various configurations other than the examples can also be adopted. In addition, the present invention is not limited to the above-described embodiment, and modifications, improvements, and the like within the range in which the object of the present invention can be achieved are included in the present invention.

In addition, in the present specification, the description was made assuming that the wavelength conversion element is a so-called "transmission type", but even in a case where the wavelength conversion element is a so-called "reflection type", the phosphor particles of the present embodiment is preferably used for producing the wavelength conversion element. Even in a case where the wavelength conversion element is of a reflection type, in a case where the phosphor layer is thin, some of the blue light passes through the phosphor layer without being absorbed, excitation light is reflected by a reflection surface on a rear side of the phosphor layer, and some of the excitation light is absorbed by the phosphor layer and emitted to the outside again, and accordingly, the reflection type and the transmission type have common concept.

EXAMPLES

The embodiment of the present invention will be described in detail based on examples and comparative examples. It is noted, just to be sure, that the present invention is not limited to only Examples.

Example 1

The phosphor particle consisting of SCASN of Example 1 was produced through the following steps.
Mixing step of mixing a starting raw material to form a raw material mixed powder,
Firing step of firing the raw material mixed powder obtained in the mixing step to obtain a fired product,
A low-temperature firing step (an annealing step) performed after a fired product obtained in the firing step is once powderized,
Crushing step of crushing and pulverizing the low-temperature fired powder obtained after the low-temperature firing step,
A decantation step of removing a fine powder generated in the crushing step, and
Acid treatment step of removing impurities that are considered to be derived from the firing step.

Hereinafter, these steps will be described in detail.

Mixing Step

The followings were mixed in a glove box maintained in a nitrogen atmosphere having moisture content of equal to or less than 1 ppm by mass and an oxygen content of equal to or less than 1 ppm by mass.

α-type silicon nitride powder ($Si_3N_4$, SN-E10 grade, manufactured by UBE Corporation) 25.65% by mass
Calcium nitride powder ($Ca_3N_2$, manufactured by Taiheiyo Cement Corporation) 2.98% by mass
Aluminum nitride powder (AlN, E grade, manufactured by Tokuyama Corporation) 22.49% by mass
Strontium nitride powder ($Sr_2N$, manufactured by Materion Corp.) 43.09% by mass
Europium oxide powder ($Eu_2O_3$, manufactured by Nippon Yttrium Co., Ltd.) 5.79% by mass In addition, the nitrogen content is determined in a case where the raw materials are blended according to the molar ratio.

The mixing was performed using a small-sized mill mixer to achieve sufficient dispersion and mixing.

After the mixing was completed, the mixture was passed through the entire sieve having an opening of 150 μm to remove aggregates, and this was used as a raw material mixed powder. Then, the raw material mixed powder was filled in a container with a lid made of tungsten.

Firing Step

A container filled with the raw material mixed powder was taken out from the glove box, quickly set in an electric furnace including a carbon heater, and the inside of the furnace was sufficiently evacuated to 0.1 Pa or less.

The heating was started while the vacuum evacuation was continued, and after reaching 850° C., nitrogen gas was introduced into the furnace, and the atmospheric pressure in the furnace was kept constant at 0.8 MPaG.

Even after the introduction of nitrogen gas was started, the temperature was continuously raised to 1950° C. The firing was carried out at a holding temperature (1950° C.) of the firing for 4 hours, and then the heating was completed and the mixture was cooled. After cooling to room temperature, a red mass collected from the container was cracked in a mortar. After that, finally, a powder (fired product) passed through a sieve having an opening of 250 μm was obtained.

Low-Temperature Firing Step (Annealing Step)

The fired product obtained in the firing step was filled in a cylindrical boron nitride container, and further placed in an electric furnace including a carbon heater. In addition, a low-temperature fired powder was obtained by holding at 1350° C. for 8 hours under an atmosphere of an argon flow at atmospheric pressure.

Crushing Step

The low-temperature fired powder obtained in the low-temperature firing step was put into a mixed liquid of water and ethanol to obtain a dispersion liquid. This dispersion liquid was ball mill-crushed by a ball mill (zirconia ball). A time and a rotation speed of the ball mill crushing are as shown in Table 1. Accordingly, a crushed powder was obtained.

Decantation Step

In order to remove the ultrafine powder from the crushed powder after the crushing step, the decantation step of removing fine powder of a supernatant liquid while precipitating the crushed powder after the crushing step was performed.

In addition, the decantation operation was performed by a method for calculating a precipitation time of the phosphor particle by setting of removing particles having a diameter of equal to or less than 2 µm by the Stokes' equation, and removing the supernatant liquid having a height equal to or higher than a predetermined height at the same time when a predetermined time elapses from the start of the precipitation. An aqueous solution of ion exchange water containing 0.05% by mass of sodium hexametaphosphate was used as a dispersion medium, and a device set to suck up the liquid above the tube with a suction port installed at the predetermined height of the cylindrical container to remove the supernatant liquid was used. The decantation operation was repeated.

Filtering and Drying Step

The precipitate obtained in the decantation step was filtered, dried, and further passed through a sieve having an opening of 75 µm. Coarse particles that did not pass through the sieve were removed.

Acid Treatment Step

The acid treatment was performed to remove the impurities that were considered to have been generated during the firing.

Specifically, the powder that had passed through the sieve above was immersed in 0.5 M of hydrochloric acid so that a powder concentration was 26.78 by mass, and the acid treatment was performed by stirring for 1 hour while further heating. After that, the powder and the hydrochloric acid solution were separated by filtration at room temperature of approximately 25° C., and the powder was washed with pure water. After that, the powder washed with pure water was dried in a dryer at a temperature equal to or higher than 100° C. and equal to or lower than 120° C. for 12 hours. Then, the dried powder was classified by a sieve having an opening of 75 µm.

From the above, the phosphor particles of Example 1 were obtained.

Comparative Example 1

The phosphor particles of Comparative Example 1 were obtained in the same manner as in Example 1, except that the decantation step was not performed (that is, the particles dispersed in the aqueous solution of sodium hexametaphosphate were filtered and dried "as whole" to obtain the phosphor particles).

Comparative Example 2

The phosphor of Comparative Example 2 was obtained in the same manner as in Example 1, except that the acid treatment step was not performed.

Comparative Example 3

The phosphor of Comparative Example 3 was obtained in the same manner as in Example 1, except that the crushing step and the acid treatment step were not performed.

Examples 2 and 3 and Comparative Examples 4 and 5

The phosphors of Examples 2 and 3 and Comparative Examples 4 and 5 were produced by changing the crushing time of the crushing step in Example 1, as shown in Table 1. Specifically, in order to change the $D_{50}$ and/or $D_{90}$ of the phosphor, the crushing time in the crushing step was set to 20 hours, 5 hours, 4 hours, and 1 hour, respectively. The steps other than the crushing time of the crushing step were the same as in Example 1.

Example 4

The phosphor particles of Example 4 were obtained in the same manner as in Example 1, except that the firing time (time held at 1950° C.) in the firing step was changed to 8 hours and the crushing time was changed to 15 hours.

Comparative Example 6

The phosphor particles were obtained in the same manner as in Example 4, except that the crushing step was not performed.

<Confirmation of Crystal Structure>

For each phosphor particle of Examples and Comparative examples, the crystal structure was confirmed by a powder X-ray diffraction pattern using a Cu-Kα ray, using an X-ray diffractometer (Ultima IV manufactured by Rigaku Co., Ltd.).

The same diffraction pattern as the (Sr, Ca) $AlSiN_3$ crystal was observed in the powder X-ray diffraction pattern of each of the phosphor particles of Examples and Comparative Examples. That is, in Examples and Comparative Examples, it was confirmed that the SCASN-based phosphor in which the main crystal phase has the same crystal structure as that of (Sr, Ca) $AlSiN_3$ was obtained.

The sheet formation of each phosphor and the evaluation of the optical characteristics were performed according to the following procedure.

<Sheet Producing Procedure>

(1) 40 parts by mass of the phosphor particle and 60 parts by mass of a silicone resin OE-6630 manufactured by Dow Corning Toray Co., Ltd. were subjected to a stirring treatment and a defoaming treatment using a rotation and revolution mixer to obtain a uniform mixture. As the rotation and revolution mixer, a model ARE-310 manufactured by Thinky Corporation was used. In addition, regarding the stirring treatment and the defoaming treatment, specifically, the stirring treatment was performed at a rotation rate of 2000 rpm for 2 minutes and 30 seconds, and then the defoaming treatment was performed at a rotation rate of 2200 rpm for 2 minutes and 30 seconds.

(2) The mixture obtained in the section (1) was added dropwise to a transparent fluororesin film (NR5100-003:100P manufactured by FLONLINE Chemical), and a transparent fluororesin film was further laminated on the dropped material. This was molded into an uncured sheet using a roller having a gap in which 50 µm was added to twice the film thickness.

(3) The uncured sheet obtained in the section (2) was heated under conditions at 150° C. for 60 minutes, and then the fluororesin film was peeled off to obtain a cured sheet having a film thickness of 50±5 µm.

<Optical Characteristics>

Figure 2:
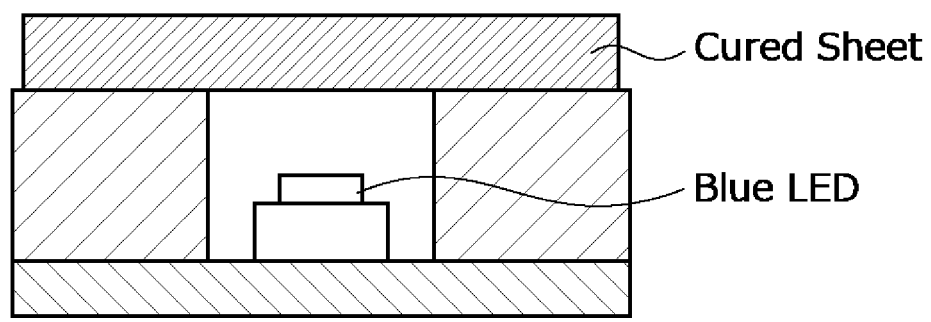
FIG. 2 is a diagram for supplementing an evaluation method in the Examples.

Using the device schematically shown in FIG. 2, blue light emitted from a blue LED having a peak wavelength in a range of 450 nm to 460 nm was emitted on one surface side of the cured sheet (the intensity of the peak wavelength of this blue light is defined as Ii [W/nm]). In addition, the intensity It [W/nm] at the peak wavelength of the light emitted from the other surface side of the cured sheet in a range of 450 nm to 460 nm, and the intensity Ip [W/nm] at the peak wavelength in a range of 600 nm to 650 nm were measured. Then, It/Ii and Ip/Ii were calculated.

In the measurement described above, the following blue LED was used.

Product number and the like: SMT type PLCC-6 0.2 W SMD 5050 LED
Peak wavelength: 450 nm to 460 nm
Chromaticity x: 0.145 to 0.165
Chromaticity y: 0.023 to 0.037

In addition, in FIG. 2, a distance between an upper surface of the blue LED and a lower surface of the cured sheet was 2 mm.

<Measurement of $D_{50}$ and $D_{90}$>

The $D_{50}$ and $D_{90}$ of each phosphor particles of Examples and Comparative Examples were measured by Microtrac MT3300EXII (Microtrac Bell Co., Ltd.), which is a particle diameter measuring device of a laser diffraction and scattering method. A specific measurement procedure is as follows.

(1) 0.5 g of a phosphor was added to 100 mL of an aqueous solution of ion exchange water mixed with 0.05% by mass of sodium hexametaphosphate, and a chip was placed in a center portion of the liquid using an ultrasonic homogenizer US-150E (manufactured by NISSEI Corporation) at an amplitude of 100%, an oscillation frequency of 19.5±1 kHz, a chip size of 20 mmφ, an amplitude of approximately 31 μm, and dispersed for 3 minutes. Accordingly, a dispersion liquid for measurement was obtained.

(2) After that, the particle diameter distribution of the phosphor particles in the dispersion liquid for measurement was measured using the particle diameter measuring device. The $D_{50}$ and $D_{90}$ were obtained from the obtained particle diameter distribution.

<Measurement of Oxygen Content>

The oxygen content of each of the phosphor particles of Examples and Comparative Examples was measured using an oxygen-nitrogen analyzer (EMGA-920, manufactured by HORIBA, Ltd.). As for the oxygen content, (i) the phosphor particles were placed in a graphite crucible, surface absorbate was removed at 280° C., and then the temperature was raised to 2400° C., and (ii) a value obtained by subtracting a background oxygen content treated under the same conditions in an empty graphite crucible previously from the measured oxygen content was used.

<Measurement of 700 nm Light Absorption Rate>

The 700 nm light absorption rate of each of the phosphor particles of Examples and Comparative Examples was measured by the following procedure.

A standard reflective plate (Spectralon (registered trademark) manufactured by Labsphere) with a reflectance of 99% was set in an opening of the integrating sphere, and monochromatic light split at a wavelength of 700 nm from a light emitting source (Xe lamp) was introduced in the integrating sphere by an optical fiber, and a reflected light spectrum was measured by a spectrophotometer (MCPD-7000 manufactured by Otsuka Electronics Co., Ltd.). At this time, the number of incident light photons (Qex (700)) was calculated from the spectrum in a wavelength range of 690 to 710 nm.

Next, the concave cell was filled with phosphor particles so that the surface was smooth and set in the opening of the integrating sphere, then monochromatic light having a wavelength of 700 nm is emitted, and the incident reflected light spectrum was measured by a spectrophotometer. The number of incident reflected light photons (Qref (700)) was calculated from the obtained spectral data. The number of incident reflected light photons (Qref (700)) was calculated in the same wavelength range as the number of incident light photons (Qex (700)). From the obtained two types of photon numbers, the 700 nm light absorption rate was calculated based on the following equation.

$$700 \text{ nm light absorption rate} = ((Qex(700) - Qref(700))/Qex(700) \times 100$$

<Measurement of 455 nm Light Absorption Rate, Internal Quantum Efficiency, External Quantum Efficiency, and Peak Wavelength>

The 455 nm light absorption rate, the internal quantum efficiency, and the external quantum efficiency of each of the phosphor particles of Examples and Comparative Examples were calculated by the following procedure.

The concave cell was filled with the phosphor particles so that the surface was smooth, and the integrating sphere was attached to the opening. Monochromatic light spectrally split into a wavelength of 455 nm from a light emitting source (Xe lamp) was introduced into the integrating sphere as the excitation light of the phosphor using an optical fiber. This monochromatic light was emitted to the phosphor sample, and the fluorescence spectrum of the sample was measured using a spectrophotometer (MCPD-7000 manufactured by Otsuka Electronics Co., Ltd.). Based on the obtained spectral data, the number of excitation reflected light photons (Qref) and the number of fluorescence photons (Qem) were calculated. The number of excitation reflected light photons was calculated in the same wavelength range as that of the number of excitation light photons, and the number of fluorescence photons was calculated in a range of 465 to 800 nm.

In addition, using the same device, a standard reflective plate (Spectralon (registered trademark) manufactured by Labsphere) having a reflectance of 99% was attached to the opening of the integrating sphere, and a spectrum of the excitation light at a wavelength of 455 nm was measured. At this time, the number of excitation light photons (Qex) was calculated from the spectrum in a wavelength range of 450 to 465 nm.

The 455 nm light absorption rate and the internal quantum efficiency of each phosphor of Examples and Comparative Examples were obtained by calculation equations shown below.

$$455 \text{ nm light absorption rate} = \{(Qex - Qref)/Qex\} \times 100$$

$$\text{Internal quantum efficiency} = \{Qem/(Qex - Qref)\} \times 100$$

In addition, the external quantum efficiency is obtained by the calculation equation shown below.

$$\text{External quantum efficiency} = (Qem/Qex) \times 100$$

Therefore, from the above equation, the external quantum efficiency has the following relationship.

External quantum efficiency =

455 nm light absorption rate × internal quantum efficiency

The peak wavelength of the phosphor particles of Examples and Comparative Examples was a wavelength showing a highest intensity at a wavelength in a range of 465 nm to 800 nm of spectral data obtained by attaching the phosphor to the opening of the integrating sphere.

<Measurement of x Value (Chromaticity X) of Cured Sheet>
The x value (chromaticity X) of the cured sheet using the phosphor particles of Examples and Comparative Examples is obtained by calculating CIE chromaticity coordinate x value (chromaticity X) in XYZ color system regulated in JIS Z8701 based on JIS Z 8724 from a wavelength range data in a range of 400 nm to 800 nm of the light emission spectrum. The larger the x value, the higher the color gamut of the projector (the red expression area expands), which is preferable.

Table 1 collectively shows the producing conditions (including raw material composition) and evaluation results of each of Examples and Comparative Examples.

TABLE 1

| SCASN phosphor | | | Unit | Example 1 | Comparative Example 1 | Comparative Example 2 | Comparative Example 3 | Example 2 |
|---|---|---|---|---|---|---|---|---|
| Producing conditions | Raw material composition | $Si_3N_4$ | Mass % | 25.65 | 25.65 | 25.65 | 25.65 | 25.65 |
| | | AlN | Mass % | 22.49 | 22.49 | 22.49 | 22.49 | 22.49 |
| | | $Eu_2O_3$ | Mass % | 5.79 | 5.79 | 5.79 | 5.79 | 5.79 |
| | | $Ca_3N_2$ | Mass % | 2.98 | 2.98 | 2.98 | 2.98 | 2.98 |
| | | $Sr_2N$ | Mass % | 43.09 | 43.09 | 43.09 | 43.09 | 43.09 |
| | Firing temperature (holding temperature) | | °C. | 1950 | 1950 | 1950 | 1950 | 1950 |
| | Firing time | | h | 4 | 4 | 4 | 4 | 4 |
| | Low-temperature firing (annealing) temperature | | °C. | 1350 | 1350 | 1350 | 1350 | 1350 |
| | Low-temperature firing (annealing) time | | h | 8 | 8 | 8 | 8 | 8 |
| | Crushing (ball mill) | Time | h | 10 | 10 | 10 | Not performed | 20 |
| | | Rotation number | rpm | 60 | 60 | 60 | Not performed | 60 |
| | Decantation | | — | Performed | Not performed | Performed | Performed | Performed |
| | Filtering drying | | — | Performed | Performed | Performed | Performed | Performed |
| | Acid treatment (containing filtering pure water washing) | | — | Performed | Performed | Not performed | Not performed | Performed |
| Evaluation | It/Ii | | — | 0.01 | 0.005 | 0.02 | 0.22 | 0.00 |
| | Ip/Ii | | — | 0.09 | 0.04 | 0.03 | 0.04 | 0.06 |
| | $D_{50}$ | | μm | 3.0 | 1.7 | 2.9 | 8.9 | 1.5 |
| | $D_{90}$ | | μm | 6.6 | 5.1 | 7.0 | 14.5 | 4.3 |
| | Oxygen content | | % | 3.7 | 4.6 | 2.1 | 1.5 | 4.2 |
| | 700 nm light absorption rate | | % | 9.3 | 21.0 | 22.5 | 20.5 | 13.2 |
| | 455 nm light absorption rate | | % | 92 | 87 | 93 | 94 | 88 |
| | Internal quantum efficiency | | % | 76 | 62 | 71 | 69 | 70 |
| | External quantum efficiency | | % | 70 | 54 | 66 | 65 | 62 |
| | Peak wavelength | | nm | 641 | 640 | 640 | 638 | 640 |
| | Chromaticity x | | — | 0.640 | 0.342 | 0.349 | 0.348 | 0.412 |

| SCASN phosphor | | | Example 3 | Comparative Example 4 | Comparative Example 5 | Example 4 | Comparative Example 6 |
|---|---|---|---|---|---|---|---|
| Producing conditions | Raw material composition | $Si_3N_4$ | 25.65 | 25.65 | 25.65 | 25.65 | 25.65 |
| | | AlN | 22.49 | 22.49 | 22.49 | 22.49 | 22.49 |
| | | $Eu_2O_3$ | 5.79 | 5.79 | 5.79 | 5.79 | 5.79 |
| | | $Ca_3N_2$ | 2.98 | 2.98 | 2.98 | 2.98 | 2.98 |
| | | $Sr_2N$ | 43.09 | 43.09 | 43.09 | 43.09 | 43.09 |
| | Firing temperature (holding temperature) | | 1950 | 1950 | 1950 | 1950 | 1950 |
| | Firing time | | 4 | 4 | 4 | 8 | 8 |
| | Low-temperature firing (annealing) temperature | | 1350 | 1350 | 1350 | 1350 | 1350 |
| | Low-temperature firing (annealing) time | | 8 | 8 | 8 | 8 | 8 |
| | Crushing (ball mill) | Time | 5 | 4 | 1 | 15 | Not performed |
| | | Rotation number | 60 | 60 | 60 | 60 | Not performed |
| | Decantation | | Performed | Performed | Performed | Performed | Performed |
| | Filtering drying | | Performed | Performed | Performed | Performed | Performed |
| | Acid treatment (containing filtering pure water washing) | | Performed | Performed | Performed | Performed | Performed |
| Evaluation | It/Ii | | 0.19 | 0.21 | 0.25 | 0.02 | 0.30 |
| | Ip/Ii | | 0.06 | 0.07 | 0.05 | 0.09 | 0.084 |
| | $D_{50}$ | | 4.9 | 5.1 | 8.5 | 2.8 | 17.0 |
| | $D_{90}$ | | 9.9 | 10.1 | 13.9 | 6.1 | 31.0 |
| | Oxygen content | | 2.4 | 2.8 | 1.9 | 3.9 | 0.9 |

TABLE 1-continued

| | | | | | |
|---|---|---|---|---|---|
| 700 nm light absorption rate | 12.5 | 13.4 | 10.2 | 10.1 | 9.0 |
| 455 nm light absorption rate | 95 | 95 | 94 | 91 | 98 |
| Internal quantum efficiency | 78 | 77 | 79 | 77 | 80 |
| External quantum efficiency | 74 | 73 | 74 | 70 | 78 |
| Peak wavelength | 639 | 641 | 643 | 641 | 641 |
| Chromaticity x | 0.364 | 0.345 | 0.323 | 0.637 | 0.277 |

As shown in Table 1, in Examples in which It/Ii was equal to or less than 0.2 and Ip/Ii was equal to or more than 0.05, a large x value was obtained. In other words, it was shown that it is preferable that the phosphor particles of Examples are used, from a viewpoint of an increase in the color gamut of the projector using the blue laser light.

On the other hand, in Comparative Examples in which It/Ii was more than 0.2 and/or Ip/Ii was less than 0.05, the x value was smaller than that in Examples.

As a reminder, the x value of Comparative Example 2 is 0.349 and the x value of Example 3 is 0.364, and this difference seems to be a small difference, but this difference is large from a viewpoint of increasing the color gamut.

In addition, from Examples and Comparative Examples shown in Table 1, although the same raw materials are used, It/Ii and Ip/Ii change depending on the conditions (time) of ball mill crushing, the presence or absence of decantation, the presence or absence of acid treatment, and the like. From this, it is found that the phosphor particle in which It/Ii is equal to or less than 0.2 and Ip/Ii is equal to or more than 0.05 is obtained by selecting appropriate producing conditions, in addition to selecting appropriate raw materials.

This application claims priority based on Japanese Patent Application No. 2020-128976 filed on Jul. 30, 2020, the disclosures of which are incorporated herein by reference in their entireties.

REFERENCE SIGNS LIST

1: substrate
2: phosphor layer (composite)
3: motor

The invention claimed is:

1. Phosphor particles for producing a wavelength conversion member of a projector, the phosphor particles comprising:
   CASN, wherein CASN is a phosphor in which a main crystal phase has a same crystal structure as that of CaAlSiN$_3$ and a general formula represented by MAlSiN$_3$:Eu in which M is one or more elements selected from Sr, Mg, Ca, and Ba; and/or
   SCASN, wherein SCASN is an Sr-containing phosphor in which a main crystal phase has a same crystal structure as that of CaAlSiN$_3$ and a general formula represented by (Sr, Ca) AlSiN$_3$:Eu,
   wherein a cured sheet produced by the following sheet producing procedure:
   (1) 40 parts by mass of the phosphor particle and 60 parts by mass of a silicone resin OE-6630 manufactured by Dow Corning Toray Co., Ltd. are subjected to a stirring treatment and a defoaming treatment using a rotation and revolution mixer to obtain a uniform mixture,
   (2) the mixture obtained in the section (1) is added dropwise to a transparent first fluororesin film, a transparent second fluororesin film is further laminated on the dropped material to obtain a sheet-like material, and this sheet-like material is molded into an uncured sheet using a roller having a gap in which 50 μm is added to a total thickness of the first fluororesin film and the second fluororesin film,
   (3) the uncured sheet obtained in the section (2) is heated under conditions of 150° C. and 60 minutes, and the first fluororesin film and the second fluororesin film are peeled off to obtain a cured sheet having a film thickness of 50±5 μm,
   satisfies the following optical characteristics:
      when an intensity at a peak wavelength of blue light emitted from a blue LED having a peak wavelength in a range of 450 nm to 460 nm is defined as Ii [W/nm], and in a case where the blue light is irradiated on one surface side of the cured sheet, an intensity of light emitted from the other surface side of the cured sheet at a peak wavelength in the range of 450 nm to 460 nm is defined as It [W/nm], and an intensity of the light emitted from the other surface side of the cured sheet at a peak wavelength in a range of 600 nm to 650 nm is defined as Ip [W/nm], It/Ii is equal to or less than 0.2 and Ip/Ii is equal to or more than 0.05.

2. The phosphor particle according to claim 1, wherein, in a case where a volume-based cumulative 50% diameter and a volume-based cumulative 90% diameter measured by a laser diffraction and scattering method are each defined as $D_{50}$ and $D_{90}$, $D_{50}$ is equal to or less than 10 μm, and $D_{90}$ is equal to or less than 17 μm, here, $D_{50}$ and $D_{90}$ are values measured by using a liquid obtained by putting 0.5 g of the phosphor particle into 100 mL of an ion exchange aqueous solution containing 0.05% by mass of sodium hexametaphosphate, and performing a dispersion treatment for 3 minutes by placing a chip in a center portion of the liquid using an ultrasonic homogenizer having a transmission frequency of 19.5±1 kHz and an amplitude of 31±5 μm.

3. The phosphor particle according to claim 1, wherein an oxygen content is equal to or more than 1% by mass.

4. The phosphor particle according to claim 1, wherein a light absorption rate with respect to light at a wavelength of 700 nm is equal to or less than 20%.

5. A composite comprising:
the phosphor particle according to claim 1; and
a sealing material that seals the phosphor particle.

6. A wavelength conversion member comprising the composite according to claim 5.

7. A projector comprising the wavelength conversion member according to claim 6.

* * * * *